United States Patent
Honeycutt et al.

(10) Patent No.: US 6,309,967 B1
(45) Date of Patent: *Oct. 30, 2001

(54) METHOD OF FORMING A CONTACT

(75) Inventors: Jeffrey Honeycutt; Sujit Sharan, both of Boise, ID (US)

(73) Assignee: Micron Technology, Inc.

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/816,165
(22) Filed: Mar. 12, 1997

Related U.S. Application Data

(62) Division of application No. 08/503,385, filed on Jul. 17, 1995, now Pat. No. 5,644,166.

(51) Int. Cl.$^7$ ................................. H01L 21/44
(52) U.S. Cl. ................ 438/658; 438/656; 438/664; 438/680; 438/661
(58) Field of Search .................. 438/658, 648, 438/649, 682, 685, 656, 664, 680, 660, 661

(56) References Cited

U.S. PATENT DOCUMENTS

| | | |
|---|---|---|
| 4,994,892 | 2/1991 | Zuleeg et al. . |
| 5,089,441 * | 2/1992 | Moslehi . |
| 5,089,872 | 2/1992 | Ozturk et al. ................... 357/23.9 |

(List continued on next page.)

FOREIGN PATENT DOCUMENTS

| | | | |
|---|---|---|---|
| 61-256732 * | 11/1986 | (JP) . | |
| 3-161926 | 7/1991 | (JP) | ................ 21/28 |

(List continued on next page.)

OTHER PUBLICATIONS

Yasuo Takahasi, et al., Reduction Reaction of Native Oxide at the Initial Stage of GeH4 Chemical Vapor Deposition on (100)Si, Appl. Phys. Lett. vol. 57, No. 6, pp. 58–99–601.

"Al–GE Reflow Sputtering for Sub–Micron–Contact–Hole Filing," K. Kikuta, T. Kikkawa and M. Aoki, 1991. VMIC Conference Proceedings, Jun. 11–12, pp. 163–169.

*Primary Examiner*—Caridad Everhart
(74) *Attorney, Agent, or Firm*—Workman, Nydegger & Seeley

(57) ABSTRACT

A high aspect ratio submicron VLSI contact and corresponding method of manufacture is disclosed. The contact is formed through an insulative layer, such as silicon dioxide, to an underlying active region on a substrate of silicon wafer. The contact comprises a layer of titanium germanosilicide at the bottom of the contact opening, and a layer of titanium germanide at the sides of the contact opening, with an overlying layer of titanium nitride. The contact is metallized, preferably using tungsten or aluminum. The disclosed method of manufacturing the contact comprises first etching the contact opening, then exposing the bottom of the contact opening to germane gas to clean native silicon dioxide from the bottom of the contact opening. A 50 Angstrom layer of germanium is then deposited over the contact opening. A layer of titanium is then deposited over the germanium layer in the contact opening. The deposition of titanium is preferably accomplished using a collimator having an aspect ratio lower than about 2.5:1. After annealing in a nitrogen atmosphere, the contact is metallized with tungsten or aluminum. The anneal step can be conducted at a temperature of around 600° C. Less titanium may be used than with conventional processes, allowing a higher aspect ratio of the contact opening as well as the use of the collimator having a lower than conventional aspect ratio.

43 Claims, 4 Drawing Sheets

U.S. PATENT DOCUMENTS

| | | |
|---|---|---|
| 5,169,803 | 12/1992 | Miyakawa . |
| 5,281,552 * | 1/1994 | King et al. . |
| 5,283,206 | 2/1994 | Sugano . |
| 5,358,616 | 10/1994 | Ward ............................... 204/192.15 |
| 5,401,674 | 3/1995 | Anjum .................................. 437/190 |
| 5,403,434 * | 4/1995 | Moslehi . |
| 5,534,463 | 7/1996 | Lee et al. ............................. 437/195 |
| 5,589,713 | 12/1996 | Lee et al. . |
| 5,644,166 * | 7/1997 | Honeycutt et al. . |
| 5,691,571 | 11/1997 | Hirose et al. . |
| 5,789,317 | 8/1998 | Batra et al. . |
| 5,904,562 * | 5/1999 | Nulman . |
| 5,963,833 * | 11/1999 | Thakur . |

FOREIGN PATENT DOCUMENTS

| | | | |
|---|---|---|---|
| 04-147618 | 5/1992 | (JP) | ......................................... 21/28 |
| 04-192562 * | 7/1992 | (JP) . | |
| 4-192562 | 7/1992 | (JP) | ......................................... 29/46 |
| 5-6995 | 1/1993 | (JP) | ..................................... 257/770 |
| 07-135187 | 5/1995 | (JP) . | |
| WO 97/49122 | 12/1997 | (WO) . | |

* cited by examiner

METHOD OF FORMING A CONTACT

This application is a divisional of application Ser. No. 08/503,385, filed Jul. 17, 1995 now U.S. Pat. No. 5,644,166.

BACKGROUND OF THE INVENTION

1. The Field of the Invention

The present invention relates to the formation of high aspect ratio submicron VLSI contacts. More specifically, the present invention is directed to depositing germanium from germane gas using an LPCVD process into a contact opening in order to remove native silicon dioxide from the contact opening. The layer of germanium in the bottom of the contact opening is consumed during annealing to form a low resistance contact.

2. The Relevant Technology

The movement toward progressive miniaturization of semiconductor devices has resulted in increasingly compact and efficient semiconductor structures. This movement has been accompanied by an increase in the complexity and number of such structures aggregated on a single semiconductor integrated chip. As feature sizes are reduced, new problems arise which must be solved in order to economically and reliably produce the semiconductor devices. The submicron features which must be reduced include, for instance, the width and spacing of metal conducting lines as well as the size of various geometric features of active semiconductor devices.

As an example, the requirement of submicron features in semiconductor manufacturing has necessitated the development of improved means of making contact with the various structures. The smaller and more complex devices are achieved, in part, by reducing device sizes and spacing and by reducing the junction depth of regions formed in the semiconductor substrate. Among the feature sizes which are reduced in size are the contact openings through which electrical contact is made to active regions in the semiconductor devices. As both the contact size and junction depth are reduced, new device metallization processes are required to overcome the problems which have been encountered.

Historically, device interconnections have been made with aluminum or aluminum alloy metallization. Aluminum, however, presents problems with junction spiking. Junction spiking results in the dissolution of silicon into the aluminum metallization and aluminum into the silicon. Typically, when aluminum contacts with the silicon substrate directly, the aluminum eutectically alloys with the silicon substrate at temperatures lower than 450° C. When such a reaction occurs, silicon is dissolved into the aluminum electrode, and there is a tendency for silicon thus dissolved into the electrode to be precipitated at a boundary between the electrode and the substrate as an epitaxial phase. This increases the resistivity across the contact. Furthermore, aluminum in the electrode is diffused into the silicon substrate from the electrode and forms an alloy spike structure in the substance.

The resulting alloy spike structure is a sharp, pointed region enriched in aluminum. The alloy spikes can extend into the interior of the substrate from the boundary between the electrode and the substrate to cause unwanted short circuit conduction at the junction of the semiconductor in the substrate, particularly when the junction is formed in an extremely shallow region of the substrate. When such an unwanted conduction occurs, the semiconductor device no longer operates properly. This problem is exacerbated with smaller device sizes, because the more shallow junctions are easily shorted, and because the silicon available to alloy with the aluminum metallization is only accessed through the small contact area, increasing the resultant depth of the spike.

Contact openings have also been metallized with chemical vapor deposited tungsten. This process has also proven problematic. The tungsten is typically deposited in an atmosphere of fluorine, which attacks the silicon, creating "wormholes" into the active region. Wormholes can extend completely through the active region, thereby shorting it out and causing the device to fail. Tungsten also presents a problem in that it does not adhere well directly to silicon.

3. Prior State of the Art

In order to eliminate the problems associated with the reaction between the silicon substrate and the metallization material, prior art solutions have typically used a diffusion barrier structure in which the reaction between the silicon substrate and the electrode is blocked by a barrier layer provided between the electrode and the substrate. Such a barrier layer prevents the diffusion of silicon and aluminum. It also provides a surface to which the tungsten will adhere and which will prevent tungsten and fluorine from diffusing into the active region. Prior art FIGS. 1 through 4 of the accompanying illustrations depict one conventional method known in the art of forming contacts having a diffusion barrier. In FIG. 1, a contact opening 18 is etched through an insulative layer 16 overlying an active region 14 on a silicon substrate 12. Insulating layer 16 typically comprises a passivation layer of intentionally formed silicon dioxide in the form of borophosphosilicate glass (BPSG). Contact opening 18 provides access to active region 14 by which an electrical contact is made. Layer 20 is a thin native oxide layer which forms on the active region from exposure to ambient. As shown in FIG. 2, a titanium metal layer 22 is then sputtered over contact opening 18 so that the exposed surface of active region 14 is coated.

A high temperature anneal step is then conducted in an atmosphere of predominantly nitrogen gas ($N_2$). Native oxide layer 20 is dissolved and titanium metal layer 22 is allowed to react with active region 14 and change titanium metal layer 22 into a dual layer. As shown in FIG. 3, a layer of titanium silicide ($TiSi_x$) 26 is formed by the anneal step, and provides a conductive interface at the surface of active region 14. A layer of titanium nitride ($TiN_x$) 24 is also formed, and acts as a diffusion barrier to the interdiffusion of tungsten and silicon or aluminum and silicon, as mentioned above. Under such conditions, the lower portion of titanium metal layer 22 overlying active region 14, after dissolving layer 20, reacts with a portion of the silicon in active region 14 to form titanium silicide region 26. Concurrently, the upper portion of titanium metal layer 22 reacts with the nitrogen gas of the atmosphere to form titanium nitride layer 24.

The next step, shown in FIG. 4, is metallization. This is typically achieved by chemical vapor deposition (CVD) of tungsten, or by the deposition of aluminum using any of the various known methods. These include aluminum reflow sputtering, and chemical vapor deposition. In the case of tungsten, the titanium nitride helps improve the adhesion between the walls of the opening and the tungsten metal. In the case of both tungsten and aluminum, the titanium nitride acts as a barrier against the diffusion of the metallization layer into the diffusion region and vice-versa.

Spiking and wormholes can still occur, even with the use of a deposition barrier, particularly when the diffusion barrier is too thin. This frequently occurs at the corners of the contact opening, where it is difficult to form a thick layer, particularly if the aspect ratio of the contact is high. Contact opening 18 of FIG. 3 is filled by a layer of aluminum 32 in FIG. 4 which depicts the effects of spiking, with a spike 34 extending through active region 14, the effect of which is to short active region 14 out.

The compound titanium nitride (TiN) is well suited to forming a diffusion barrier, as it is extremely hard, chemically inert, an excellent conductor, and has a high melting point. It also makes excellent contact with other conductive layers. Titanium nitride is typically formed by the reaction of sputtered titanium during annealing in nitrogen, or can be deposited directly on the substrate by reactive sputtering, evaporation, chemical vapor deposition and the like before the deposition of the metallization.

As device dimensions continue to shrink and the contact openings become deeper and narrower, contact walls become vertical and most of the metal deposition techniques fail to provide the necessary step coverage to create adequate contact with the active area. Such narrow, high aspect ratio contact openings can result in a partial or total failure to make significant contact with the active region. Accordingly, it becomes increasingly difficult to produce the desired thickness of titanium at the bottom of the contact opening.

FIG. 5 shows the dimensions used to calculate the aspect ratio, which is the ratio of the height H to the width W. In order to introduce a sufficiently thick layer of titanium 22 using conventional sputtering techniques and thereby create an effective diffusion barrier 50, the aspect ratio of contact opening 18 is required to be kept relatively low, generally under 2:1.

The aspect ratios of contacts have been increased in the past by depositing the titanium layer using a collimator to directly sputter deposit plasma emanating from a target into the bottom of the contact openings on a silicon wafer. The use of a collimator to direct titanium layer metal 22 in FIG. 2 to the bottom of contact opening 18 prevents unwanted structures from forming on the walls of contact opening 18 and thereby plugging contact opening 18.

A collimator having a honeycomb structure has an aspect ratio corresponding to the diameter of the openings in the honeycomb structure divided by the thickness of the honeycomb structure. In order to deposit the thick layers of titanium needed for this conventional method, the honeycomb structure used in collimator sputtering has been required to have a high aspect ratio, typically around 2.5:1. This slows down the manufacturing process and reduces throughput. Higher aspect ratios also require a high surface area of the collimator. A consequence of a high surface area is a concomitant increase in particle contamination, and a reduced deposition ratio on the wafer.

Other undesirable effects result from the conventional contact forming method. For instance, a high temperature of 800° C. or greater is required during the anneal step to properly form titanium silicide region 26 as shown in FIG. 3. In practice, high temperatures tend to cause loss to the titanium silicide layer and can cause the BPSG to crack and to reflow.

Another function of depositing a titanium layer in a contact opening is to remove native silicon dioxide ($SiO_2$) which forms whenever the wafer is exposed to air. Typical native silicon dioxide layers have a thickness of about 20 Angstroms. Such a layer is shown at 20 in FIG. 1. Native silicon dioxide layer 20 is highly insulative and can cause a high contact resistance so as to result in failure of the device.

Titanium layer 22 of FIG. 2 serves to carry away oxygen, breaking down silicon dioxide layer 20. In the process, a portion of titanium layer 22 is consumed. As a result, even more titanium must be deposited in order to form an effective diffusion barrier.

Prior art methods employed plasma cleaning to remove the silicon dioxide from the bottom of the contact openings prior to depositing titanium. These processes have proven unsatisfactory, as they are quite expensive, decrease throughput, and may require substantially higher RTP annealing temperatures. Furthermore, since native silicon dioxide grows in air, these methods do not prevent the reformation of native silicon dioxide in the contact openings once the methods are concluded.

For these reasons, there is a need in the art for an improved method of creating diffusion barriers in contacts that minimize the amount of material needed for effective diffusion barriers. This will in turn allow greater miniaturization of devices. Such a method would be more desirable if it also had increased throughput, lowered costs, and increased yields.

SUMMARY AND OBJECTS OF THE INVENTION

The present invention seeks to resolve the above and other problems which have been experienced in the art. More particularly, the present invention constitutes an advancement in the art by providing high aspect ratio submicron VLSI contacts and a method of making the contacts which achieve each of the objects listed below.

It is an object of the present invention to provide a high aspect ratio submicron VLSI contact having a titanium nitride diffusion barrier with an accompanying method for creating the contact whereby the amount of titanium deposited in forming the diffusion barrier is low.

It is likewise an object to provide such a contact and method through which the aspect ratio of the contact can be successfully increased to allow for greater miniaturization of the devices placed on microchips.

It is also an object of the present invention to provide such a method whereby annealing temperatures can be reduced in order to retain greater control over production processes, including increased throughput and maintaining the size of the active regions.

It is further an object of the present invention to provide such a method whereby native silicon dioxide may be cleaned from the bottom of the contact holes by germane gas with the use of a low pressure chemical vapor deposition process that also produces a layer of germanium in the contact opening to assist in the formation of a contact barrier and react with the titanium to form a low resistivity contact.

It is also an object of the present invention to provide such a method that allows the use of collimated sputtering with a low aspect ratio of the collimator device. It is a further object of the present invention to provide such a method whereby more of the deposited layer of titanium is available to form a contact material layer at the bottom of the contact opening.

It is further an object of the present invention to provide such a method resulting in lower expense, higher yields and greater throughput, and creating a contact having better electrical connections and greater reliability.

To achieve the foregoing objects, and in accordance with the invention as embodied and described herein, the present invention comprises a submicron VLSI contact and a corresponding method for manufacturing the contact. The submicron VLSI contact comprises a silicon substrate having formed thereon an active region. An insulating layer such as silicon dioxide or BPSG overlies the active region. A contact opening is etched through the insulating layer to access the underlying active region. At the bottom of the contact opening is formed a region of titanium germanosilicide. At the sides of the contact opening is a layer of titanium germanide. Over the titanium germanide and germanosilicide layers is a layer of titanium nitride. The remainder of the contact opening is filled with a metal such as tungsten or aluminum. The germanium used in forming the contact may be doped in order to avoid depleting the active region.

The corresponding method of manufacturing the high aspect ratio submicron contact comprises the following steps. First, the active region must be doped and covered with an insulating layer. The insulating layer is typically formed by covering the active region with BPSG, reflowing the BPSG, and planarizing it. The silicon substrate and the contact holes are then etched into the insulating layer down to the active region, typically using photolithography and dry etch procedures. The contact opening is then exposed to germane gas ($GeH_4$) at a temperature of between about 2000° to 6000° C., at a pressure of 1 to 150 Torr, and for a period of time of about 60 seconds. This time may vary, but should be sufficient to remove the native oxide layer that has grown at the bottom of the contact opening, and to deposit approximately 50 Angstroms of germanium at the bottom of the contact opening. Following the foregoing steps, a layer of titanium having a thickness at approximately 100 Angstroms is deposited over the layer of germanium. This is typically done using a sputtering process. Since the titanium layer may be much thinner than with conventional methods, the sputtering process may be completed with the use of a collimator having a lower aspect ratio.

The next step is to anneal the contact opening in an atmosphere of nitrogen gas ($N_2$). This is done at a lower temperature than the conventional method, with the preferred temperature being about 600° C. The anneal step causes the bottom of the contact opening to form a region of titanium germanosilicide, and to form at the sides of the contact opening a layer of titanium germanide. An overlying layer of titanium nitride, which has been found to be an effective diffusion barrier, is formed over both layers.

Since a much thinner titanium layer can be deposited, the contact can have a higher aspect ratio. Aspect ratios greater than about 2:1 are attainable. The improved diffusion barrier of titanium nitride effectively prohibits spiking and wormholes from forming in the active region. Other advantages of the present invention include a higher yield and a more stable BPSG layer due to the use of a lower temperature anneal.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which:

FIG. 4 also illustrates the consequences of an insufficient contact barrier, which are shown as spikes penetrating through the active region.

FIG. 5 also shows the dimensions of the contact opening used in calculating the aspect ratio.

DETAILED DESCRIPTION OF THE PREFERRED EMBODIMENTS

The present invention comprises a high aspect ratio submicron VLSI contact and a method for forming the high aspect ratio submicron VLSI contact. The present invention utilizes a sacrificial CVD germanium layer in order to form a more intimate electrical contact, and a more efficient diffusion barrier at the bottom of the contact. The method of the present invention is highly beneficial in the formation of electrical contacts to devices such as diodes, resistors, capacitors, transistors, and other semiconductor devices formed in high density on microchips. The method of the present invention, is shown by steps in FIGS. 1, and 5–8.

Figure 1:
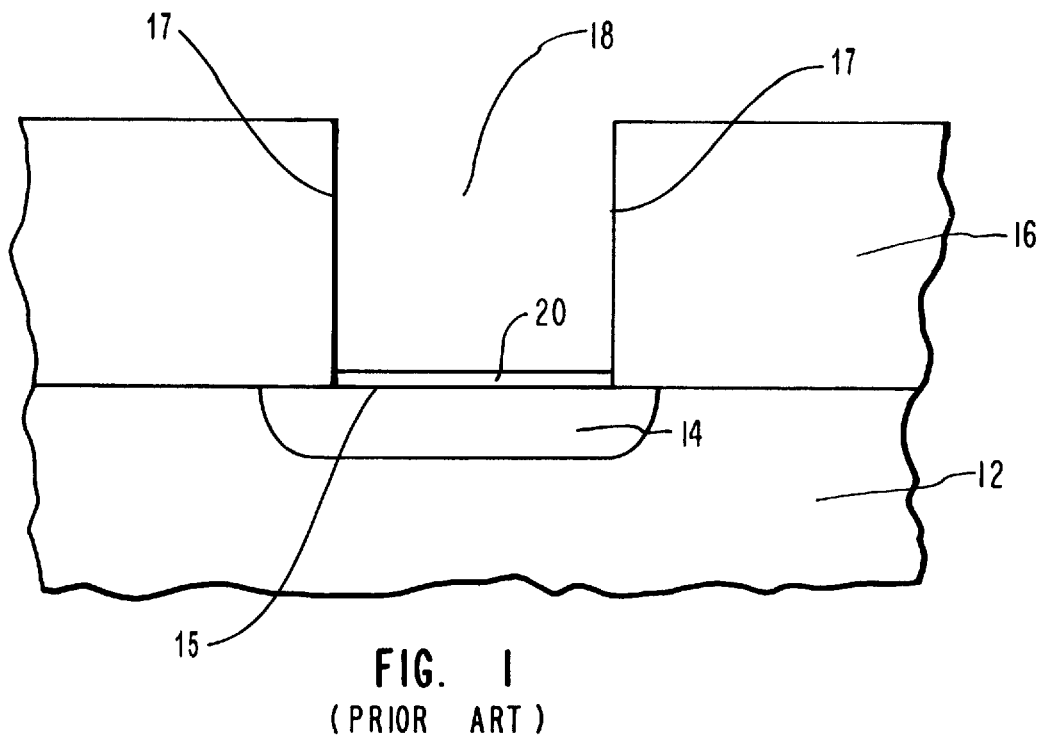
FIG. 1 is a cross-sectional elevation view showing the manner in which a typical contact opening is formed through an insulative layer to the surface of a substrate of a silicon wafer.
Figure 2:
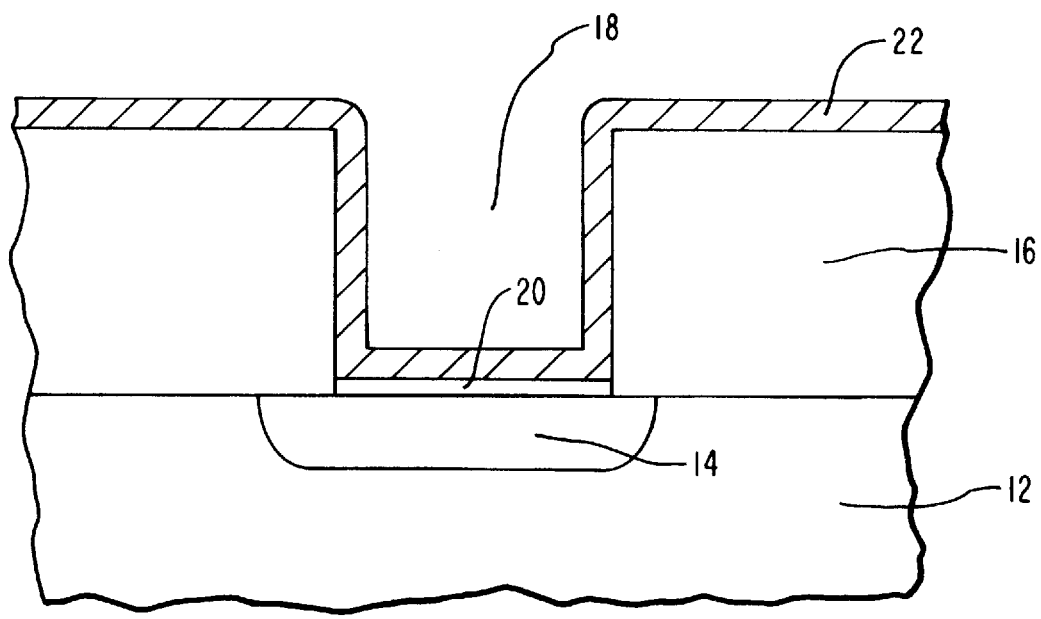
FIG. 2 is a cross-sectional elevation view illustrating the next step in the known conventional method for producing a contact, and comprises depositing a titanium layer into the contact opening.
Figure 3:
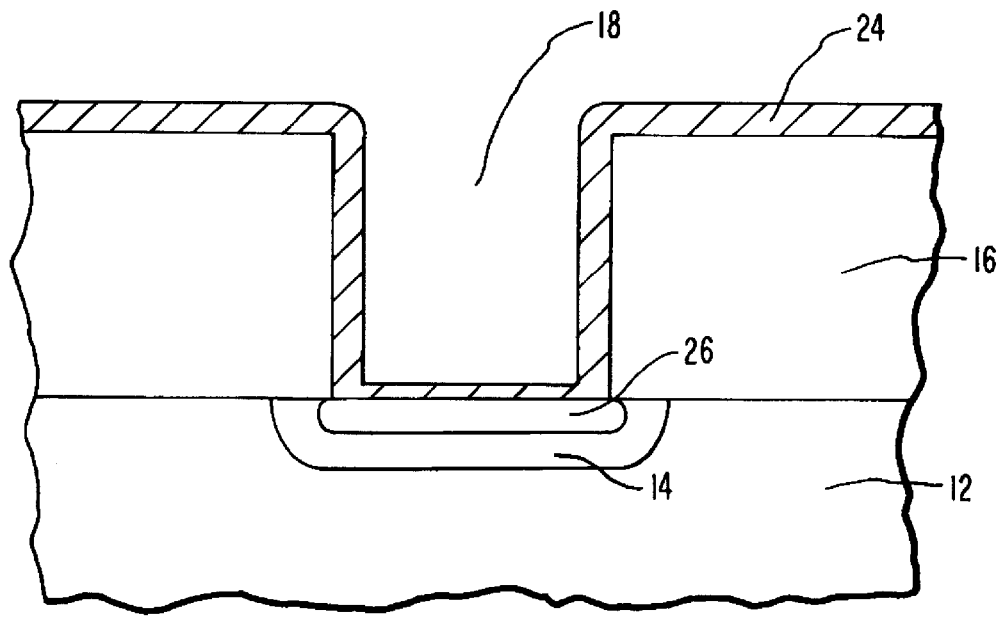
FIG. 3 is a cross-sectional elevation view illustrating the next step in the conventional known process for producing a contact, comprising annealing in a nitrogen gas atmosphere with titanium to deposit an underlying titanium silicide region and an overlying titanium nitride layer.
Figure 4:
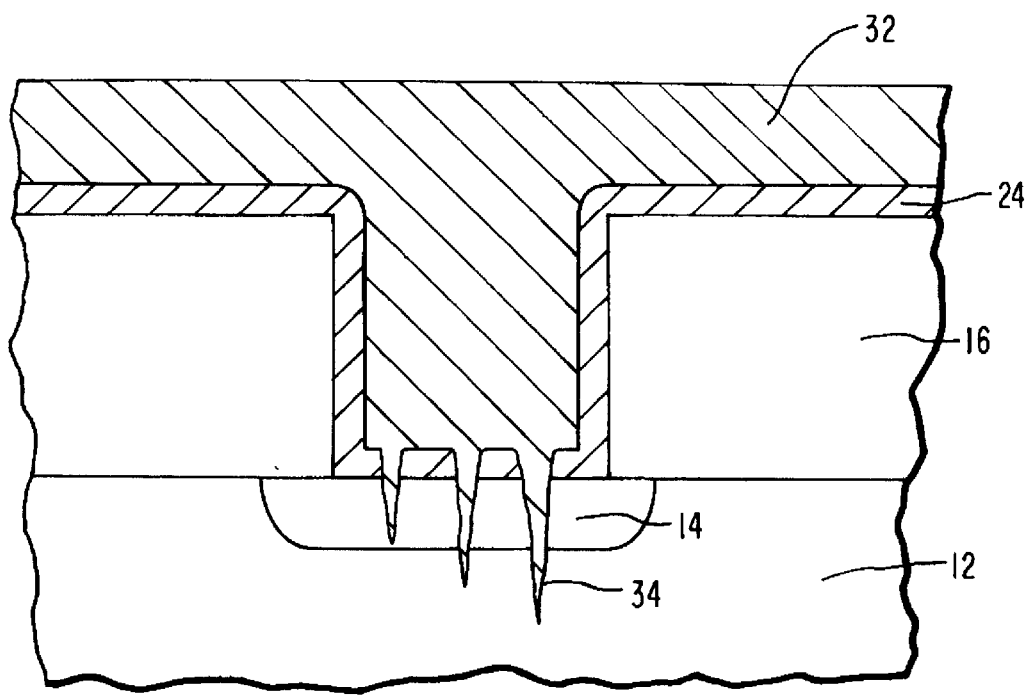
FIG. 4 is a cross-sectional elevation view illustrating the next step in the conventional known process for producing a contact, and comprises metallizing the contact opening.

Shown in FIG. 1 is a substrate 12 as the surface of a silicon wafer. An active region 14 is created on substrate 12 by doping a portion thereof. Next, a protective insulative silicon dioxide layer 16 is formed over active region 14. Silicon dioxide layer 16 preferably comprises BPSG in order to allow it to reflow at temperatures of 900° C. or below. Silicon dioxide layer 16 is preferably reflowed and planarized to form a flat surface on substrate 12. In order to access the underlying active region 14, a contact opening 18 is etched through insulating layer 16 by a process of masking and etching, preferably dry etching, as is commonly known in the art.

In order to clean a layer of native oxide 20 from the bottom of the contact opening 18, and in order to form an effective diffusion barrier in preparation of metallizing contact opening 18, substrate 12 is exposed in a vacuum environment to germane gas ($GeH_4$). This is preferably done using a low pressure chemical vapor deposition (LPCVD) technique. The process is preferably conducted with a pressure of about 80 Torr, a temperature of about 500° C., a germane concentration of about 100%, and for a duration of about 60 seconds. The germane gas effectively cleans native oxide layer 20 from the bottom of contact opening 18 by turning the silicon dioxide into a silicon sub-oxide ($SiO_x$) (X<2), which can be removed from the contact opening by sublimation in vacuum at a temperature of around 600° C. The cleaning of native oxide layer 20 from the bottom of contact opening 18 allows for optimal electrical contact between the metallization layer and underlying active region 14. It also allows an overlying layer of titanium to be as thin as possible.

Figure 5:
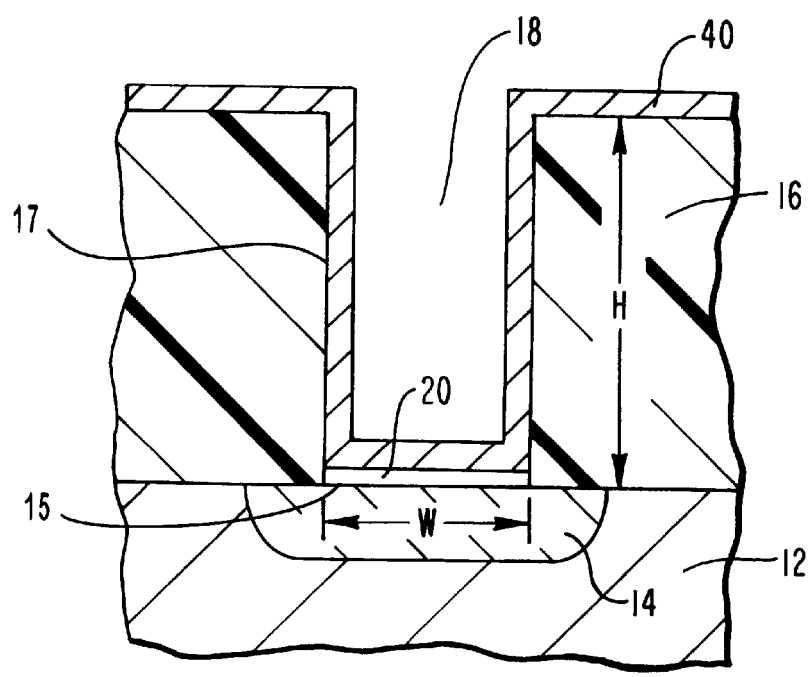
FIG. 5 is a cross sectional elevational view showing the results of a step for producing a high aspect ratio submicron VLSI contact under the present invention, and comprises exposing the contact opening to germane gas to deposit a layer of germanium over the contact opening.

The LPCVD process should be of sufficient duration to remove native silicon dioxide layer 20 and to also deposit a layer of germanium 40, having an optimal thickness of about 50 Angstroms, in the bottom of contact opening 18. Germanium layer 40, as shown in FIG. 5, seals the bottom of contact opening 18 against the subsequent growth of native silicon dioxide. While 50 Angstroms of germanium layer 40 is preferred, a thickness in the range of about 30 to 100 Angstroms is also contemplated.

Figure 6:
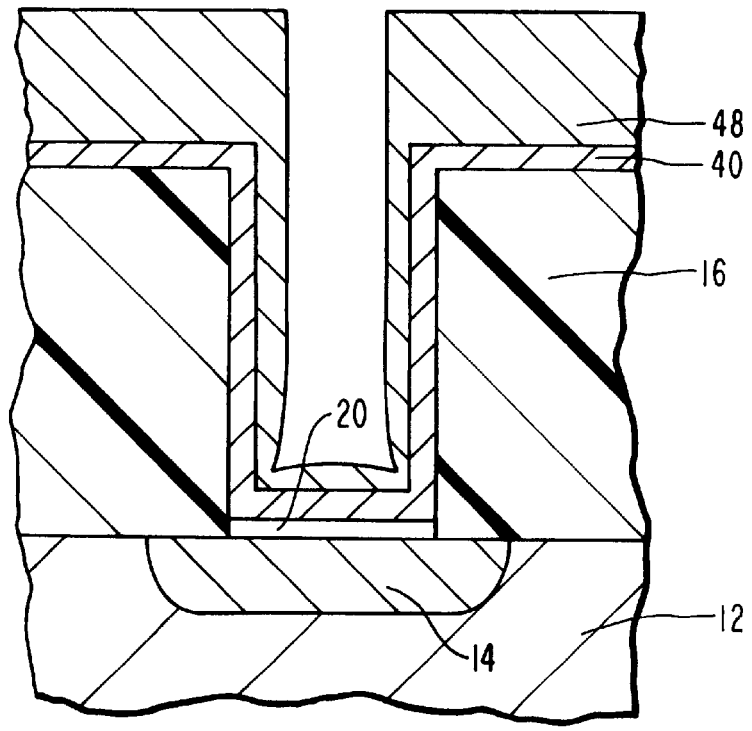
FIG. 6 is a cross-sectional elevation view illustrating the next step of the process of the present invention, comprising depositing a layer of titanium over the germanium layer.

As shown in FIG. 6, a titanium layer 48 is then formed over germanium layer 40. Titanium layer 48 may be deposited by sputtering, CVD, or by other processes by which titanium is deposited. While titanium layer 48 at the bottom of contact opening 18 may be thicker, or even slightly thinner than germanium layer 40, in order to completely react with germanium layer 40 and silicon in active region 14, titanium layer 48 should be of approximately the same thickness as germanium layer 40. Since the titanium need not react with the silicon dioxide as in the conventional method, titanium layer 48 may be much thinner than typically used, typically a reduction of about 150 Angstroms, as used in conventional processes, to about 50 Angstroms, which is preferred for the present invention.

Since less titanium need be laid in the bottom of contact opening 18 than with the conventional process, the aspect ratio of contact opening 18 may be substantially increased. As a result, aspect ratios above 2:1 are now attainable with the present invention. This increase in aspect ratio in turn increases the number of devices that may be placed on a microchip, thereby aiding in the miniaturization process.

Titanium layer 48 is preferably deposited using a honeycomb structured collimator sputtering technique. By allowing a thinner layer of titanium 48, the aspect ratio of the holes in the honeycomb structure of the collimator may be reduced. In conventional processes, the aspect ratio of the collimator is about 2.5:1. Using the current invention, this can be reduced to 2:1 or even as low as about 1.5 to 1. This speeds up the process, and due to the reduced surface area of the collimator, results in lower particle contamination. This will in turn result in a higher device yield.

During the LPCVD process, the germanium can be doped in situ, with either N+ or P+ dopants, depending on whether the underlying junction is doped with N+ or P+ dopants. This can be done by adding sources of boron, phosphorus, arsenic or other dopants to the LPCVD procedure. Examples of dopants are phosphine ($PH_3$), used with a P+ active region, and diborane ($B_2H_6$), used with a N+ active region. This will prevent germanium layer 40 from reacting with the dopant and depleting active region 14.

Figure 7:
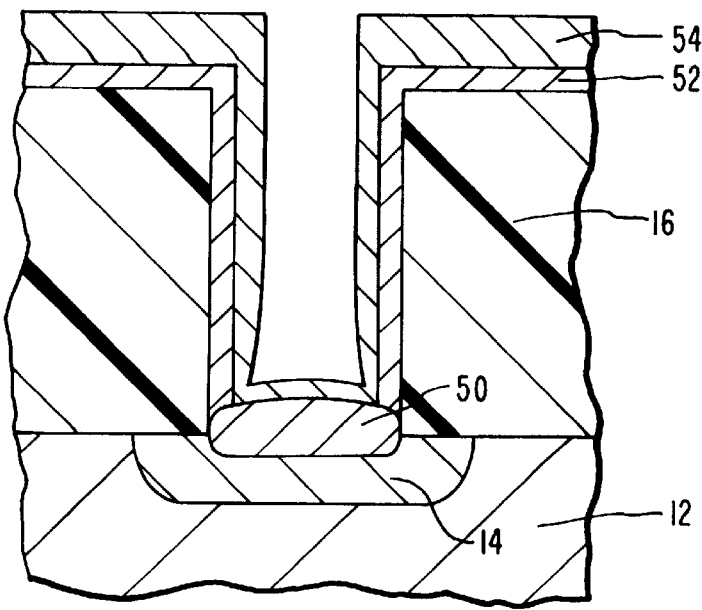
FIG. 7 is a cross sectional elevation view illustrating the next step of the process of the present invention, which is annealing in a nitrogen gas atmosphere to form a layer of titanium germanosilicide at the bottom of the contact opening, titanium germanide at the sides of the contact opening, and an overlying layer of titanium nitride.

Next, contact opening 18 is annealed, the result of which is shown in FIG. 7. This is preferably done using rapid thermal processing (RTP) in an atmosphere of nitrogen gas ($N_2$) and for a time period of about 20 to 60 seconds. The anneal step may be conducted at substantially lower temperatures than with conventional techniques. For example, conventional techniques use a temperature of about 800° C. for the anneal, while it is preferred under the method of the present invention to use a temperature of about 600° C.

As a result of the anneal step, a region of titanium germanosilicide ($TiSi_xGe_y$) 50 is formed at the bottom of contact opening 18 and a layer of titanium germanide ($TiGe_x$) 52 is formed at the sides of contact opening 18. The nitrogen gas also combines with titanium layer 48 to form a layer of titanium nitride (TiN) 54 above both layers. Germanium layer 40 is sacrificially consumed in the process. The alloy will vary, but it is preferred that variable X in ($TiSi_xGe_y$) have a value of 1, that variable Y in ($TiSi_xGe_y$) have a value of 1, and that variable X in ($TiGe_x$) have a value typically of 2.

Titanium germanosilicide can be formed at lower temperatures than titanium silicide ($TiSi_x$), allowing a lower temperature anneal. This has the additional benefits of stabilizing the contact, avoiding cracking or detrimental reflow effects of the BPSG insulating layer, and helping to maintain the size of the active region 14.

Figure 8:
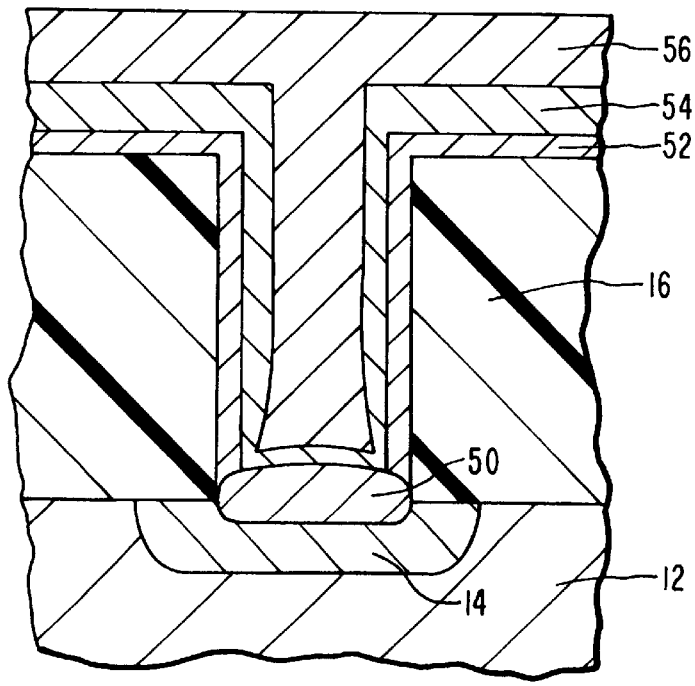
FIG. 8 is a cross sectional elevation view showing the last step of the process, which comprises metallizing the contact opening with a metal such as tungsten or aluminum

The final step, shown in FIG. 8, is metallization. In this step, a metal 56 is deposited to fill the remainder of contact opening 18. This is preferably done using either a tungsten plug formation process or an aluminum reflow, sputter, or CVD process.

The resulting contact has high step coverage with strong adhesion, high electrical conduction, and can be more easily miniaturized as a result of the higher aspect ratio permitted. The process can also be conducted at lower temperatures and with higher throughput. An effective diffusion barrier is created that resists pitting, spiking, and wormholes. The resulting microchip will have better reliability and a higher yield.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by united states letters patent is:

1. A method of forming a contact on a substrate comprising:

forming a layer of insulating material over the substrate having therein an active region;

forming a contact opening into the layer of insulating material on the substrate to open an access to the active region, wherein the contact opening has an aspect ratio greater than about 2:1; and exposing a layer of native silicon dioxide on the substrate over the active area to germane gas so as to react with and remove the layer of native silicon dioxide from the substrate.

2. A method as recited in claim 1, wherein the exposing is a low pressure, chemical vapor deposition process of a germanium layer.

3. A method as recited in claim 1, wherein the exposing deposits a layer of germanium on the substrate from the exposure of the layer of native silicon dioxide on the substrate to germane gas.

4. A method as recited in claim 3, further comprising depositing a layer of a refractory metal over the layer of germanium.

5. A method as recited in claim 4, wherein the layer of refractory metal is substantially composed of titanium and is formed on the layer of germanium, the layer of titanium being of substantially the same thickness as the layer of germanium.

6. A method as recited in claim 3, wherein the layer of germanium has a thickness in the range of between approximately 30 to 300 Angstroms.

7. A method as recited in claim 5, further comprising annealing the substrate at a temperature of form about 550° C. to about 850° C., wherein the contact opening has a bottom and a sidewall, and wherein the annealing is in a nitrogen gas atmosphere so as to form a layer of titanium geimanosilicide at the bottom of the contact opening, a layer of titanium gelmanide at the sidewall of the contact opening, and an layer of titanium nitride over the titanium geimanosilicide and the titanium germanide.

8. A method as recited in claim 5, wherein the titanium layer is sputter deposited using a collimator having a honeycomb structure, and wherein the honeycomb structure of the collimator has an aspect ratio of less than about 2.5:1.

9. A method as recited in claim 4, further comprising annealing the substrate.

10. A method as recited in claim 9, wherein the contact opening has a bottom and a sidewall, and wherein the annealing is in a nitrogen gas atmosphere so as to form a layer of refractory metal gelmanosilicide at the bottom of the contact opening, a layer of refractory metal germanide at the sidewall of the contact opening, and an layer of refractory metal nitride over the refractory metal germanosilicide and refractory metal geimanide.

11. A method as recited in claim 10, wherein the layer of refractory metal germanosilicide at the bottom of the contact is substantially composed of $X_w Ge_x Si_{1-x}$, where X is a refractory metal.

12. A method as recited in claim 1, further comprising doping the germane gas during the exposure with a dopant compatible with a dopant of the active region on which the contact is to be formed in order to maintain a substantially consistent level of doping of the active region.

13. A method of forming a contact on a silicon substrate comprising:
   forming a layer of insulating material over the silicon substrate;
   forming a contact opening having a bottom and a sidewall into the layer of insulating material on the substrate to open an access to an active region therein, the contact opening having an aspect ratio of greater than about 2:1;
   exposing at least the bottom of the contact opening to germane gas to react with and clean a layer of native silicon dioxide from the bottom of the contact opening and to form a layer of germanium over the contact opening;
   depositing a layer of titanium over the layer of germanium;
   annealing the contact opening in an atmosphere of nitrogen gas to form a layer of titanium germanosilicide at the bottom of the contact opening, a layer of titanium germanide at the sides of the contact opening, and an layer of titanium nitride over the layer of gemanosilicide; and depositing a metal into the remainder of the contact opening.

14. A method as recited in claim 13, wherein the layer of germanium over the contact opening has a thickness in a range from about 30 Angstroms to about 300 Angstroms.

15. A method as recited in claim 13, wherein the layer of titanium is approximately the same thickness as the layer of germanium over the contact opening.

16. A method as recited in claim 13, wherein the layer of germanium is deposited using a collimator having a honeycomb structure, the honeycomb structure of the collimator having an aspect ratio less than about 2.5:1.

17. A method as recited in claim 13, wherein the annealing is at a temperature less than about 600° C.

18. A method of forming a contact on a silicon substrate comprising:
   forming a layer of insulating material on the silicon substrate, the silicon substrate having an active area therein;
   forming a contact opening having a bottom and a sidewall through the layer of insulating material on the substrate to open an access to the active region, the contact opening having an aspect ratio of greater than about 2:1;
   exposing at least the bottom of the contact opening to germane gas to react with and remove a layer of native silicon dioxide from the bottom of the contact opening, and to form a layer of germanium over the contact opening;
   depositing a layer of refractory metal over the layer of germanium;
   annealing the silicon substrate in an atmosphere of nitrogen gas to form a layer of refractory metal geimanosilicide at the bottom of the contact opening, a layer of refractory metal gelmanide at the sides of the contact opening, and an layer of refractory metal nitride over the layer of refractory metal gemanosilicide; and
   substantially filling the contact opening with a conductive material.

19. A method as recited in claim 18, wherein the layer of germanium has a thickness in a range from about 30 Angstroms to about 300 Angstroms.

20. A method as recited in claim 18, wherein the layer of refractory metal is approximately the same thickness as the germanium.

21. A method as recited in claim 18, wherein the layer of refractory metal is deposited by physical vapor deposition using a collimator having a honeycomb structure, the honeycomb structure of the collimator having an aspect ratio less than about 2.5:1.

22. A method as recited in claim 18, wherein the refractory metal is substantially composed of titanium.

23. A method as recited in claim 22, wherein the annealing is at a temperature out 600° C.

24. A method of forming a contact on a substrate comprising:
   forming a layer of insulating material over the substrate having therein an active region;
   forming a contact opening into the layer of insulating material on the substrate to open an access to the active region; and
   exposing a layer of native silicon dioxide on the substrate over the active area to germane gas so as to react with and remove the layer of native silicon dioxide from the substrate and so as to deposit a layer of germanium having a thickness in the range of between approximately 30 to 300 Angstroms on the substrate.

25. The method as defined in claim 24, wherein the deposit of the layer of germanium is a low pressure, chemical vapor deposition process.

26. A method as recited in claim 24, further comprising depositing a layer of a refractory metal over the layer of germanium.

27. A method as recited in claim 26, wherein the layer of refractory metal is composed of titanium and is formed on the layer of germanium, the layer of titanium being of substantially the same thickness as the layer of germanium.

28. A method as recited in claim 27, further comprising annealing the substrate.

29. A method as recited in claim 27, further comprising annealing the substrate at a temperature of from about 550° C. to about 850° C., wherein the contact opening has a bottom and a sidewall, and wherein the annealing is in a nitrogen gas atmosphere so as to form a layer of titanium germanosilicide at the bottom of the contact opening, a layer of titanium germanide at the sidewall of the contact opening, and an layer of titanium nitride over the titanium germanosilicide and the titanium germanide.

30. A method as recited in claim 24, further comprising doping the germane gas during the exposure with a dopant compatible with a dopant of the active region on which the contact is to be formed in order to maintain a substantially consistent level of doping of the active region.

31. A method as recited in claim 24, wherein the contact opening has an aspect ratio greater than about 2:1.

32. A method as recited in claim 27, wherein the titanium layer is sputter deposited using a collimator having a honeycomb structure, and wherein the honeycomb structure of the collimator has an aspect ratio of less than about 2.5:1.

33. A method of forming a contact on a substrate comprising:

forming a layer of insulating material over the substrate having therein an active region;

forming a contact opening into the layer of insulating material on the substrate to open an access to the active region;

exposing a layer of native silicon dioxide on the substrate over the active area to germane gas so as to react with and remove the layer of native silicon dioxide from the substrate and so as to deposit a layer of germanium having a thickness on the substrate;

depositing a layer of a titanium over the layer of germanium wherein the thickness of the layer of titanium is substantially the same as that of the layer of germanium.

34. The method as defined in claim 33, wherein the deposit of the layer of germanium is a low pressure, chemical vapor deposition process.

35. A method as recited in claim 33, wherein the layer of germanium has a thickness in the range of between approximately 30 to 300 Angstroms.

36. A method as recited in claim 33, further comprising annealing the substrate.

37. A method as recited in claim 33, further comprising annealing the substrate at a temperature of form about 550° C. to about 850° C., wherein the contact opening has a bottom and a sidewall, and wherein the annealing is in a nitrogen gas atmosphere so as to form a layer of titanium geimanosilicide at the bottom of the contact opening, a layer of titanium geimanide at the sidewall of the contact opening, and an layer of titanium nitride over the titanium geirmanosilicide and the titanium germanide.

38. A method as recited in claim 33, further comprising doping the germane gas during the exposure with a dopant compatible with a dopant of the active region on which the contact is to be formed in order to maintain a substantially consistent level of doping of the active region.

39. A method as recited in claim 33, wherein the contact opening has an aspect ratio greater than about 2:1.

40. A method as recited in claim 33, wherein the titanium layer is sputter deposited using a collimator having a honeycomb structure, and wherein the honeycomb structure of the collimator has an aspect ratio of less than about 2.5:1.

41. A method of forming a contact structure to a contact on a layer of silicon, the method comprising:

forming a contact opening in a layer of an electrically insulative material situated upon the layer of silicon, the contact opening having a bottom, a sidewall, and terminating at a contact on an active region within the silicon;

forming refractory metal germanosilicide at the bottom of the contact opening;

forming refractory metal germanide on the sidewall of the contact opening;

forming a diffusion barrier within the contact opening upon the refractory metal germanosilicide and the refractory metal germanide;

forming an electrically conductive material within the contact opening upon the diffusion barrier.

42. The method as defined in claim 41, wherein titanium is the refractory metal of the:

refractory metal germanosilicide;

refractory metal germanide; and a refractory metal nitride that is the diffusion barrier.

43. A method of forming a structure having a contact situated upon silicon, the contact being at the bottom of a contact opening having a sidewall that extends through a layer of a second material that is situated upon the silicon, the method comprising:

forming refractory metal germanosilicide at the contact;

forming refractory metal germanide on the sidewall;

forming refractory metal nitride within the contact opening upon the refractory metal germanosilicide and the refractory metal germanide;

forming a third material within the contact opening upon the refractory metal nitride.

* * * * *

UNITED STATES PATENT AND TRADEMARK OFFICE
CERTIFICATE OF CORRECTION

PATENT NO.   : 6,309,967 B1
DATED        : October 30, 2001
INVENTOR(S)  : Jeffrey Honeycutt and Sujit Sharan It is certified that error appears in the above-identified patent and that said Letters Patent is hereby corrected as shown below:

<u>Title page,</u>
Item [56], OTHER PUBLICATIONS, change 'Filing."' to -- Filling." --

<u>Column 2,</u>
Line 21, change "aluninum" to -- aluminum --

<u>Column 5,</u>
Line 22, change "2000º to 6000º" to -- 200º to 600º --
Line 57, after "order" change "that" to -- to illustrate --

<u>Column 6,</u>
Line 39, after "aluminum" insert -- . --

<u>Column 8,</u>
Line 44, change "illustrated" to -- illustrative --
Lines 49-50, change "united states letters patent" to -- United States Letters Patent --

<u>Column 9,</u>
Line 14, before "about" change "form" to -- from --
Line 19, change "geimanosilicide" to -- germanosilicide --
Line 20, before "layer" change "an" to -- a --
Lines 20-21, change "geimanosilicide" to -- germanosilicide --
Line 32, change "gelmanosilicide" to -- germanosilicide --
Line 34, before "layer" change "an" to -- a --
Line 65, change "an" to -- a --
Lines 66-67, change "gemanosilicide" to -- germanosilicide --

<u>Column 10,</u>
Lines 33-34, change "geimanosilicide" to -- germanosilicide --
Line 35, change "gelmanide" to -- germanide --
Line 36, before "layer" change "an" to -- a --
Line 37, change "gemanosilicide" to -- germanosilicide --
Line 54, after "temperature" change "out" to -- less than about --

<u>Column 11,</u>
Line 20, before "layer" change "an" to -- a --

UNITED STATES PATENT AND TRADEMARK OFFICE
CERTIFICATE OF CORRECTION

PATENT NO.    : 6,309,967 B1
DATED         : October 30, 2001
INVENTOR(S)   : Jeffrey Honeycutt and Sujit Sharan It is certified that error appears in the above-identified patent and that said Letters Patent is hereby corrected as shown below:

Column 12,
Line 2, change "form" to -- from --
Line 6, change "geimanosilicide" to -- germanosilicide --
Line 7, after "titanium" change "geimanide" to -- germanide --
Line 8, before "layer" change "an" to -- a --
Lines 8-9, change "geirmanosilicide" to -- germanosilicide --

Signed and Sealed this

Twenty-first Day of January, 2003

JAMES E. ROGAN
*Director of the United States Patent and Trademark Office*